United States Patent [19]

Kuniya et al.

[11] Patent Number: 4,917,722
[45] Date of Patent: Apr. 17, 1990

[54] SINGLE CRYSTALS OF CHROMIUM AND METHOD FOR PRODUCING THE SAME

[75] Inventors: Tsutomu Kuniya; Koichi Hanawa; Tomoyuki Oikawa, all of Kanagawa, Japan

[73] Assignee: Tosoh Corporation, Yamaguchi, Japan

[21] Appl. No.: 353,415

[22] Filed: May 18, 1989

[30] Foreign Application Priority Data

| May 18, 1988 | [JP] | Japan | 63-119303 |
| May 20, 1988 | [JP] | Japan | 63-122143 |
| May 23, 1988 | [JP] | Japan | 63-123930 |
| May 24, 1988 | [JP] | Japan | 63-124951 |
| May 27, 1988 | [JP] | Japan | 63-128253 |
| May 27, 1988 | [JP] | Japan | 63-128254 |
| May 31, 1988 | [JP] | Japan | 63-131690 |
| May 31, 1988 | [JP] | Japan | 63-131691 |

[51] Int. Cl.$^4$ ............................................. C22C 29/12
[52] U.S. Cl. .................................. 75/232; 148/126.1; 148/133; 148/423; 148/404; 148/428; 419/19; 419/23; 419/28; 419/29; 419/49; 419/43; 419/48
[58] Field of Search ................ 148/1, 133, 126.1, 423, 148/404, 428; 419/23, 49, 19, 29, 48, 28, 43; 75/232

[56] References Cited

U.S. PATENT DOCUMENTS 4,583,608 4/1986 Field et al. ............................... 148/1

Primary Examiner—Stephen J. Lechert, Jr.
Assistant Examiner—Nina Bhat
Attorney, Agent, or Firm—Sughrue, Mion, Zinn, Macpeak & Seas

[57] ABSTRACT

A method for producing a single crystal of chromium is disclosed, comprising sintering a chromium molding to thereby apply thereto a thermal strain and heat treating the resulting thermally strained chromium molding. The method achieves high efficiency of crystal growth and produces a single-crystal chromium molding of complicated shape.

17 Claims, No Drawings

SINGLE CRYSTALS OF CHROMIUM AND METHOD FOR PRODUCING THE SAME

FIELD OF THE INVENTION

This invention relates to single crystals of chromium and a method for producing the same.

BACKGROUND OF THE INVENTION

Chromium, though excellent in corrosion resistance and heat resistance, is limited in its application to use chiefly as additives to alloys. Under the present situation, use of chromium as a single substance has not been put into practical use except as a target material for sputtering.

Limitation of application of chromium arises from brittleness in itself attributed to brittleness of grain boundaries. Plastic processing of chromium is therefore very difficult. Hence, production of practical chromium moldings cannot but rely on processes having poor yields, such as discharge processing and wire cutting, and it has been virtually impossible to obtain chromium moldings of complicated shapes.

Problems due to brittleness of grain boundaries of metals, such as chromium, can be fundamentally solved by obtaining single crystals having no boundaries.

Known techniques for obtaining single crystals of metals, for example, molybdenum, include secondary recrystallization as described in No. JP-A-59-141,498 (the term "JP-A" as used herein means an "unexamined published Japanese patent application"). In carrying out this method, addition of an additive called a pinning element to a single crystal component is an essential condition, and strict quantitative control of the additive, e.g., CaO and MgO, is required.

A currently widespread method for obtaining chromium single crystals is a floating zone melting method. This method however involves various problems, such as limited productivity per unit time, limitation of the products in shape to a bar of relatively small diameter, and need of a very complicated apparatus for creating a reducing atmosphere. It has thus been extremely difficult to obtain a chromium single crystal having a complicated shape.

If a large-sized, optionally shaped chromium single crystal can be obtained easily, the problem of poor yields in working by the conventional processing techniques would be eliminated, and application to electronic parts of relatively complicated shape could be expected, thus greatly broadening the application of chromium.

SUMMARY OF THE INVENTION

The inventions have conducted extensive studies on the preparation of chromium single crystals, paying attention to the behavior of impurities unavoidably present in a chromium component, e.g., Fe, Al, Ni, and Si, in crystal growth by secondary recrystallization. As a result, they have noted that these impurities exert a favorable influence on the crystal growth of chromium and found that a chromium single crystal can be obtained by first sintering chromium and then heat-treating the sintered chromium to cause secondary recrystallization.

That is, the present invention provides a single crystal of chromium and a method for producing the same which comprises heat-treating a sintered chromium molding having strain.

As a result of further investigations, it has been found that the conditions of the above-described heat treatment can be made milder by using a chromium molding obtained by sintering chromium followed by plastic processing. It has also been found that the heat treatment conditions can also be made milder by using chromium having incorporated thereinto silicon (Si) and/or cobalt (Co) in a specific ratio(s).

DETAILED DESCRIPTION OF THE INVENTION

The terminology "single crystal" as used herein means a real single crystal or an aggregate of relatively large single crystals having an average diameter of from 0.5 to 5 cm.

Refining of chromium ore is performed by reducing smelting or electrolytic refining. Chromium ore contains impurities, e.g., Fe, Al, Si, Ni, and Cu, in addition to chromium. Chromium as obtained by the electrolytic refining process, which is considered to give the highest purity, still contains impurities, such as 20 to 1000 ppm of Fe, 1 to 20 ppm of Al, and 30 to 600 ppm (in the form of $SiO_2$) of Si. As mentioned above, these impurities unavoidably existing in chromium give a favorable influence on crystal growth by secondary recrystallization. From this point of view, it is preferable to use electrolytic chromium as a raw material. Chromium obtained by reducing smelting may also be used by incorporating Si, Co, etc.

Incorporation of Si into chromium can be carried out by previously adding $SiO_2$ to a chromium component for obtaining chromium, such as chromium oxide. This method is the most preferred in the present invention. Addition of $SiO_2$ may be effected by any means as long as incorporation of other impurities may be prevented and a uniform composition may be obtained. The $SiO_2$ is added in a total amount of from 0.002 to 0.1% by weight based on the chromium component. Amounts less than 0.002% produce no significant effect of addition, and amounts exceeding 0.1% cause excessive pinning effects of boundaries, making it difficult to produce a single crystal.

Since $SiO_2$, even added within the above-recited range, may sometimes be locally precipitated in the chromium component, a preferred amount of $SiO_2$ to be added is between 0.005% and 0.03% by weight.

Cobalt may be incorporated into chromium as a raw material or at any stage during refining of chromium as a chromium to be sintered contains a requisite amount of Co. The amount of Co to be added ranges from 0.01 to 3% by weight based on the chromium component. Amounts less than 0.01% produce no significant effect of addition, and amounts exceeding 3% adversely affect crystal growth of chromium. Incorporation of Co makes the heat treatment condition milder. This effect is believed ascribable to the catalytic activity of Co in recrystallization of chromium. Further, incorporation of Si, is expected to bring a pinning effect.

When both of Si and Co are incorporated into the chromium component, the method of addition and amounts thereof follow the respective description given above.

The above-described chromium as a raw material is powderized in a usual manner and sintered. Sintering is conducted according to any of commonly employed techniques, such as burning and hot isostatic pressing (HIP), so that the sintered material may undergo thermal strain. The sintering temperature is usually higher than 1200° C. and lower than the melting point of chromium. The sintering time is not particularly limited. Ten or more minutes' sintering is usually sufficient. The sintering pressure is above 1000 atms. The molding container to be used for sintering is appropriately selected so as to impart a desired shape to the resulting sintered product.

As mentioned above, the resulting sintered and molded product can be subjected to plastic processing thereby making the subsequent heat treatment conditions milder. The plastic processing is not particularly restricted and includes generally employed methods, for example, rolling, forging, and extrusion working. For example, rolling is preferably carried out at a temperature lower than about 700° C. at a draft (rolling ratio) of from 30 to 90%.

The thus obtained chromium molding is then subjected to heat treatment, i.e., secondary recrystallization. The heat treatment is carried out at a temperature of 1300° C. or higher and less than the melting point of chromium (1860° C.) for at least 30 minutes in a reducing atmosphere, though these conditions vary depending on whether the sintered product has been subjected to plastic processing or the kind of additives used. In the case of using chromium having incorporated thereinto Co as described above, the heat treatment can be effected at relatively low temperatures (e.g., 1300° C.). In the case of using chromium alone, the heat treatment should be performed at relativey high temperatures (e.g., 1500° C.).

The heat-treated chromium is a single crystal and can be confirmed by an X-ray back reflection Laue method.

According to the method of the present invention, a single crystal of chromium having an arbitrary shape can be obtained efficiently, and a chromium molded article of complicated shape can be produced. The secondary recrystallization according to the present invention can be carried out under relatively mild conditions by subjecting a chromium sintered product to plastic processing or using, as a raw material, chromium containing Si and/or Co.

The present invention is now illustrated in greater detail with reference to the following Examples, but it should be understood that the present invention is not deemed to be limited thereto. In these examples, all the percents are by weight unless otherwise indicated. Further, the determination if a product is a single crystal was carried out by an X-ray back reflection Laue method.

EXAMPLE 1

High purity chromium obtained by electrolytic refining was sintered by an HIP method. The chromium used contained 99.98% of chromium, 40 ppm of Si, and 50 ppm of Fe. The sintering conditions were 1200° to 1300° C. in temperature, 1 hour in time, and 1200 to 2000 atms. in pressure.

The sintered product was cut to a size of 100 mm×300 mm×30 mm, and the cut piece was heat-treated at 1600° C. for 3 hours in a hydrogen atmosphere. The product was confirmed to be a single crystal by an X-ray back reflection Laue method.

The influences of the sintering temperature and pressure on crystal growth in the secondary recrystallization are tabulated in Table 1. For comparison, the crystal condition of the heat-treated product having been sintered at 1000° C. is also shown in Table 1.

TABLE 1

| Sintering Condition | | |
|---|---|---|
| Temperature (°C.) | Pressure (atms) | Crystal Condition |
| 1000 | 1800 | fine grains |
| 1200 | 1800 | giant grains |
| 1300 | 1800 | singe crystal |
| 1300 | 1200 | giant grains* (partly**) |
| 1300 | 1600 | single crystal |
| 1300 | 2000 | single crystal |

*The term "giant grain" as used herein means an aggregate of relatively large single crystals.
**The term "partly" as used herein means a state that fine grains and giant grains are present together.

EXAMPLE 2

The same procedure of Example 1 was repeated, except for fixing the sintering temperature at 1250° C. and the sintering pressure at 1500 atms. and varying the heat treatment temperature from 1200° to 1600° C. The influence of the heat treatment temperature on the crystal growth is shown in Table 2.

TABLE 2

| Heat Treatment Temperature (°C.) | Crystal Condition |
|---|---|
| 1200 | fine grains |
| 1300 | fine grains |
| 1400 | fine grains |
| 1500 | giant grains (partly) |
| 1600 | single crystal |

EXAMPLE 3

Plastic Processing

A sintered product as obtained in the same manner as in Example 1 was hot-rolled at 500° C. at a draft of 60%, and a piece of 100 mm×300 mm×30 mm was cut out. The cut piece was heat-treated at 1600° C. in a hydrogen atmosphere for 3 hours. The product was confirmed to be a single crystal by an X-ray back reflection Laue method. The influences of the sintering temperature and pressure upon crystal growth are shown in Table 3.

For comparison, when a sintered product obtained by sintering at 1000° C. was directly (i.e., without plastic processing) subjected to the heat treatment, the resulting recrystallized product was found to be fine grains.

TABLE 3

| Sintering Condition | | |
|---|---|---|
| Temperature (°C.) | Pressure (atms) | Crystal Condition |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

EXAMPLE 4

The same procedure of Example 3 was repeated, except for fixing the sintering temperature at 1250° C. and the sintering pressure at 1500 atms. and varying the heat treatment temperature from 1200° C. to 1600° C. The results obtained are shown in Table 4.

TABLE 4

| Heat Treatment Temperature (°C.) | Crystal Condition |
| --- | --- |
| 1200 | fine grains |
| 1300 | fine grains |
| 1400 | giant grains (partly) |
| 1500 | single crystal |
| 1600 | single crystal |

EXAMPLE 5

Si Doping and Plastic Processing

Silicon dioxide ($SiO_2$) was added to chromium oxide in an amount up to 0.2% (2000 ppm) by a wet process, and the Si-doped chromium oxide was reduced to chromium by heating at 1550° C. for 10 hours in hydrogen. The chromium was then sintered by an HIP method at a temperature varying from 1200° C. to 1300° C. under a pressure varying from 1200 to 2000 atms. for 1 hour to obtain an ingot. The ingot was rolled at 500° C. at a draft varying from 30 to 90%, and a piece of 100 mm×300 mm×30 mm was cut out of the rolled sheet. The cut piece was heat-treated at 1500° C. for 3 hours in a hydrogen atmosphere.

For comparison, the same procedure was repeated, except that the sintering was conducted at 1000° C. under a pressure of 1800 atms. and no rolling was conducted. In this case, the resulting recrystallized product was found to be fine grains.

The influence of the $SiO_2$ content on crystal growth, the sintering conditions being fixed at 1250° C. and 1500 atms. and the draft being fixed at 40%, is shown in Table 5. The influence of the sintering conditions on crystal growth, the $SiO_2$ content being fixed at 100 ppm and the draft being fixed at 40%, is shown in Table 6. The influence of the draft in rolling on crystal growth, with the $SiO_2$ content being fixed at 100 ppm and the sintering conditions being fixed at 1250° C. and 1500 atms., is shown in Table 7.

Further, the same procedure as described above was repeated except that the $SiO_2$ content was fixed at 100 ppm, the sintering conditions were fixed at 1250° C. and 1500 atms., and the heat treatment temperature was varied between 1200° C. and 1600° C. The results obtained are shown in Table 8.

TABLE 5

| $SiO_2$ Content (ppm) | Crystal Condition |
| --- | --- |
| 0 | fine grains |
| 50 | giant grains |
| 100 | single crystal |
| 500 | single crystal |
| 1000 | giant grains (partly) |
| 2000 | fine grains |

TABLE 6

| Sintering Condition | | Crystal Condition |
| --- | --- | --- |
| Temperature (°C.) | Pressure (atms) | |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

TABLE 7

| Draft (%) | Crystal Condition |
| --- | --- |
| 30 | giant grains |
| 50 | single crystal |
| 60 | single crystal |
| 70 | single crystal |
| 90 | giant grains |

TABLE 8

| Heat Treatment Temperature (°C.) | Crystal Condition |
| --- | --- |
| 1200 | fine grains |
| 1300 | fine grains |
| 1400 | giant grains (partly) |
| 1500 | single crystal |
| 1600 | single crystal |

EXAMPLE 6

Co Doping

A chromium-based alloy containing from 0.01 to 50% of cobalt was prepared from high purity electrolytic chromium by an arc melting process. The resulting chromium alloy was ground and mixed with high purity electrolytic chromium so as to have a final Co content of from 0.001 to 5%. The high purity electrolytic chromium used contained 99.98% of Cr, 80 ppm of Si and 50 ppm of Fe. The resulting Co-doped chromium was sintered by an HIP method at a temperature varying from 1200° to 1300° C. under a pressure varying from 1200 to 2000 atms. for 1 hour.

The sintered product was rolled at 500° C. at a draft varying from 30 to 90%, and cut to a piece of 100 mm×300 mm×30 mm. The cut piece was heat-treated at 1500° C. for 3 hours in a hydrogen atmosphere.

The influence of the Co content on crystal growth, with the sintering temperature and pressure being fixed at 1250° C. and 1500 atms. and the draft being fixed at 40%, is shown in Table 9. The influence of the sintering temperature and pressure on crystal growth, with the Co content being fixed at 0.1% and the draft being fixed at 40%, is shown in Table 10. The influence of the draft on crystal growth is shown in Table 11, with the Co content being fixed at 0.1% and the sintering temperature and pressure being fixed at 1250° C. and 1500 atms., respectively.

TABLE 9

| Co Content (%) | Crystal Condition |
| --- | --- |
| 0.001 | single crystal |
| 0.01 | single crystal |
| 0.1 | single crystal |
| 1 | single crystal |
| 3 | giant grains (partly) |
| 5 | fine grains |

TABLE 10

| Sintering Condition | | |
|---|---|---|
| Temperature (°C.) | Pressure (atms) | Crystal Condition |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

TABLE 11

| Draft (%) | Crystal Condition |
|---|---|
| 0 | fine grains |
| 10 | fine grains |
| 30 | giant grains |
| 50 | single crystal |
| 60 | single crystal |

EXAMPLE 7

The same procedure of Example 6 was repeated, except that the heat treatment temperature was varied between 1200° C. and 1600° C. while fixing the Co content at 0.1% and fixing the sintering conditions at 1250° C. and 1500 atms. The results obtained are shown in Table 12.

TABLE 12

| Heat Treatment Temperature (°C.) | Crystal Condition |
|---|---|
| 1200 | fine grains |
| 1300 | giant grains (partly) |
| 1400 | giant grains |
| 1500 | single crystal |
| 1600 | single crystal |

EXAMPLE 8

Doping with Co and Si

Silicon dioxide (SiO$_2$) and cobalt oxide were added to chromium oxide by a wet process. The former was added in such an amount that the SiO$_2$ content after reduction of the chromium oxide to chromium might be 80 ppm, and the latter was added in an amount of from 0.1 to 5% based on the chromium oxide. The Co- and Si-doped chromium oxide was reduced at 1550° C. for 10 hours in hydrogen, and the resulting chromium was sintered by an HIP method at a temperature varying from 1200° to 1300° C. under a pressure varying from 1200 to 2000 atms. for 1 hour to obtain an ingot.

The ingot was cut to a size of 100 mm × 300 mm × 30 mm, and the cut piece was heat-treated at 1500° C. for 3 hours in a hydrogen atmosphere.

The influence of the Co content on crystal growth (the SiO$_2$ content was fixed at 100 ppm, and the sintering conditions were fixed at 1250° C. and 1500 atms.); the influence of the SiO$_2$ content on crystal growth (the Co content was fixed at 0.1%, and the sintering conditions were fixed at 1250° C. and 1500 atms.); and the influence of the sintering conditions on crystal growth (the SiO$_2$ content was fixed at 100 ppm, and the Co content was fixed at 0.1%) are shown in Tables 13, 14, and 15, respectively.

TABLE 13

| Co Content (%) | Crystal Condition |
|---|---|
| 0.001 | single crystal |
| 0.01 | single crystal |
| 0.1 | single crystal |
| 1 | single crystal |
| 3 | giant grains (partly) |
| 5 | fine grains |

TABLE 14

| SiO$_2$ Content (ppm) | Crystal Condition |
|---|---|
| 0 | fine grains |
| 50 | giant grains |
| 100 | single crystal |
| 500 | single crystal |
| 1000 | giant grains (partly) |
| 2000 | fine grains |

TABLE 15

| Sintering Condition | | |
|---|---|---|
| Temperature (°C.) | Pressure (atm) | Crystal Condition |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

EXAMPLE 9

The same procedure of Example 8 was repeated, except for fixing the Co content and SiO$_2$ content at 0.1% and 100 ppm, respectively, fixing the sintering conditions at 1250° C. and 1500 atms., and varying the heat treatment temperature from 1200° to 1600° C. The results obtained are shown in Table 16.

TABLE 16

| Heat Treatment Temperature (°C.) | Crystal Condition |
|---|---|
| 1200 | fine grains |
| 1300 | giant grains (partly) |
| 1400 | giant grains |
| 1500 | single crystal |
| 1600 | single crystal |

EXAMPLE 10

Si Doping

A chromium ingot was prepared in the same manner as in Example 5, except for varying the sintering temperature between 1100° C. and 1300° C. The ingot was cut to a size of 100 mm × 300 mm × 30 mm, and the cut piece was heat-treated at 1600° C. for 3 hours in a hydrogen atmosphere. The influence of the SiO$_2$ content on crystal growth (the sintering conditions were fixed at 1250° C. and 100 ppm), and the influence of the sintering conditions on crystal growth (the SiO$_2$ content was fixed at 100 ppm) are shown in Tables 17 and 18, respectively.

TABLE 17

| SiO₂ Content (ppm) | Crystal Condition |
| --- | --- |
| 0 | fine grains |
| 50 | giant grains |
| 100 | single crystal |
| 500 | single crystal |
| 1000 | giant grains (partly) |
| 2000 | fine grains |

TABLE 15

| Sintering Condition | | |
| --- | --- | --- |
| Temperature (°C.) | Pressure (atm) | Crystal Condition |
| 1100 | 1800 | giant grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

EXAMPLE 11

The same procedure of Example 10 was repeated, except that the SiO₂ content was fixed at 100 ppm and the sintering conditions were fixed at 1250° C. and 1500 atms. while varying the heat treatment temperature between 1200° C. and 1600° C. The results obtained are shown in Table 19.

TABLE 19

| Heat Treatment Temperature (°C.) | Crystal Condition |
| --- | --- |
| 1200 | fine grains |
| 1300 | fine grains |
| 1400 | fine grains |
| 1500 | giant grains (partly) |
| 1600 | single crystal |

EXAMPLE 12

The same procedure of Example 6 was repeated, except that no rolling was conducted.

The influence of the Co content on crystal growth, with the sintering conditions being fixed at 1250° C. and 1500 atms., is shown in Table 20, and the influence of the sintering conditions on crystal growth, with the Co content being fixed at 0.1%, is shown in Table 21.

TABLE 20

| Co Content (%) | Crystal Condition |
| --- | --- |
| 0.001 | single crystal |
| 0.01 | single crystal |
| 0.1 | single crystal |
| 1 | single crystal |
| 3 | giant grains (partly) |
| 5 | fine grains |

TABLE 21

| Sintering Condition | | |
| --- | --- | --- |
| Temperature (°C.) | Pressure (atm) | Crystal Condition |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |

TABLE 21-continued

| Sintering Condition | | |
| --- | --- | --- |
| Temperature (°C.) | Pressure (atm) | Crystal Condition |
| 1300 | 2000 | single crystal |

EXAMPLE 13

The same procedure of Example 8 was repeated, except that the Co content was fixed at 0.1% and the sintering conditions were fixed at 1250° C. and 1500 atms., while varying the heat treatment temperature between 1200° C. and 1600° C. The results obtained are shown in Table 22.

TABLE 22

| Heat Treatment Temperature (°C.) | Crystal Condition |
| --- | --- |
| 1200 | fine grains |
| 1300 | giant grains (partly) |
| 1400 | giant grains |
| 1500 | single crystal |
| 1600 | single crystal |

EXAMPLE 14

An ingot as obtained in the same manner as in Example 8 was rolled at 500° C. at a draft of 30 to 90% and cut to a size of 100 mm × 300 mm × 30 mm. The cut piece was heat treated at 1500° C. for 3 hours in a hydrogen atmosphere. The influence of the Co content on crystal growth, with the SiO₂ content being fixed at 80 ppm, the sintering conditions being fixed at 1250° C. and 1500 atms., and the draft being fixed at 40%, is shown in Table 23. The influence of the SiO₂ content on crystal growth, with the Co content being fixed at 0.1%, the sintering conditions being fixed at 1250° C. and 1500 atms., and the draft being fixed at 40%, is shown in Table 24. The influence of the sintering conditions on crystal growth, with the Co content and SiO₂ content being fixed at 0.1% and 80 ppm, respectively, and the draft being fixed at 40%, is shown in Table 25. The influence of the draft on crystal growth, with the Co content and SiO₂ content being fixed at 0.1% and 80 ppm, respectively, and the sintering conditions being fixed at 1250° C. and 1500 atms., is shown in Table 26.

TABLE 23

| Co Content (%) | Crystal Condition |
| --- | --- |
| 0.001 | single crystal |
| 0.01 | single crystal |
| 0.1 | single crystal |
| 1 | single crystal |
| 3 | giant grains (partly) |
| 5 | fine grains |

TABLE 24

| SiO₂ Content (ppm) | Crystal Condition |
| --- | --- |
| 0 | fine grains |
| 50 | giant grains |
| 100 | single crystal |
| 500 | single crystal |
| 1000 | giant grains (partly) |
| 2000 | fine grains |

TABLE 25

| Sintering Condition | | |
|---|---|---|
| Temperature (°C.) | Pressure (atm) | Crystal Condition |
| 1000 | 1800 | fine grains |
| 1200 | 1800 | giant grains |
| 1300 | 1800 | single crystal |
| 1300 | 1200 | giant grains (partly) |
| 1300 | 1600 | single crystal |
| 1300 | 2000 | single crystal |

TABLE 26

| Draft (%) | Crystal Condition |
|---|---|
| 0 | fine grains |
| 10 | fine grains |
| 30 | single crystal |
| 50 | single crystal |
| 60 | single crystal |
| 70 | giant grains |
| 80 | giant grains |
| 90 | giant grains (partly) |

EXAMPLE 15

The same procedure of Example 14 was repeated, except for fixing the Co content and SiO$_2$ content at 0.1% and 100 ppm, respectively, fixing the sintering conditions at 1250° C. and 1500 atms., fixing the draft at 40%, and varying the heat treatment temperature from 1200° to 1600° C. The results obtained are shown in Table 27.

TABLE 27

| Heat Treatment Temperature (°C.) | Crystal Condition |
|---|---|
| 1200 | fine grains |
| 1300 | giant grains (partly) |
| 1400 | giant grains |
| 1500 | single crystal |
| 1600 | single crystal |

While the invention has been described in detail and with reference to specific embodiments thereof, it will be apparent to one skilled in the art that various changes and modifications can be made therein without departing from the spirit and scope thereof.

What is claimed is:

1. A method for producing a single crystal of chromium, comprising sintering a chromium molding to thereby apply thereto a thermal strain and heat treating the thermally strained chromium molding.

2. A method as claimed in claim 1, wherein said method further includes plastic processing of the thermally strained chromium molding.

3. A method as claimed in claim 1, wherein said sintering is carried out by hot isostatic pressing.

4. A method as claimed in claim 2, wherein said sintering is carried out by hot isostatic pressing.

5. A method as claimed in claim 1, wherein said chromium to be sintered contains Si and/or Co.

6. A method as claimed in claim 2, wherein said chromium to be sintered contains Si and/or Co.

7. A method as claimed in claim 3, wherein said chromium to be sintered contains Si and/or Co.

8. A method as claimed in claim 5, wherein Si is present in the form of SiO$_2$ in a total amount of from 0.002% to 0.1% by weight based on chromium.

9. A method as claimed in claim 6, wherein Si is present in the form of SiO$_2$ in a total amount of from 0.002% to 0.1% by weight based on chromium.

10. A method as claimed in claim 7, wherein Si is present in the form of SiO$_2$ in a total amount of from 0.002% to 0.1% by weight based on chromium.

11. A method as claimed in claim 5, wherein Co is present in an amount of from 0.01% to 3% by weight based on chromium.

12. A method as claimed in claim 6, wherein Co is present in an amount of from 0.01% to 3% by weight based on chromium.

13. A method as claimed in claim 7, wherein Co is present in an amount of from 0.01% to 3% by weight based on chromium.

14. A method as claimed in claim 1, wherein said sintering is at a temperature of 1200° C. or higher under a pressure of 1000 atms. or higher.

15. A method as claimed in claim 2, wherein said plastic processing is rolling conducted at a temperature of about 700° C. or lower and at a draft of from 30 to 90%.

16. A method as claimed in claim 1, wherein said heat treating is at a temperature of from 1300° C. and less than the melting point of chromium.

17. Single crystals of chromium comprising chromium having incorporated thereinto silicon in the form of SiO$_2$ in a total amount of from 0.002% to 0.1% by weight based on chromium and/or cobalt in an amount of from 0.01% to 3% by weight based on chromium.

* * * * *